(12) United States Patent
Nakano

(10) Patent No.: US 6,737,921 B2
(45) Date of Patent: May 18, 2004

(54) DISTRIBUTED AMPLIFIER AND DIFFERENTIAL DISTRIBUTED AMPLIFIER

(75) Inventor: Hiroyuki Nakano, Yasu-gun (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 10/300,194

(22) Filed: Nov. 20, 2002

(65) Prior Publication Data

US 2003/0102922 A1 Jun. 5, 2003

(30) Foreign Application Priority Data

Dec. 5, 2001 (JP) .......................... 2001-370999

(51) Int. Cl.[7] .............. H03F 3/60; H03F 3/14
(52) U.S. Cl. .................. 330/286; 330/53; 330/54; 330/307
(58) Field of Search .................. 330/286, 53, 54, 330/307

(56) References Cited

U.S. PATENT DOCUMENTS

| 4,543,535 A | * | 9/1985 | Ayasli .................. 330/53 |
| 4,772,858 A | * | 9/1988 | Tsukii et al. ............ 330/277 |
| 4,885,483 A |   | 12/1989 | Aitchison ............. 307/492 |
| 4,947,136 A |   | 8/1990 | Helms ................. 330/54 |
| 5,208,547 A | * | 5/1993 | Schindler ............. 330/54 |
| 5,386,130 A | * | 1/1995 | Gamand et al. ........ 257/275 |
| 2001/0002803 A1 |   | 6/2001 | Sato |
| 2002/0008583 A1 |   | 1/2002 | Shigematsu |

FOREIGN PATENT DOCUMENTS

| JP | 2001160723 | 6/2001 |
| JP | 2002 33627 | 1/2002 |

* cited by examiner

*Primary Examiner*—Patricia Nguyen
(74) *Attorney, Agent, or Firm*—Ostrolenk, Faber, Gerb & Soffen, LLP (57) ABSTRACT

Four unit FETs are linearly disposed in the length direction of the belt-shaped gate electrode. The neighboring drain electrodes and the neighboring gate electrodes are connected through high-impedance transmission lines, respectively. The end opposite to the output portion of the circuit connecting the drain electrodes and the end opposite to the input portion of the circuit connecting the gate electrodes electrically in consecutive order are connected to terminating circuits having no resistor, and the other ends are connected to a source wiring metal.

14 Claims, 7 Drawing Sheets

DISTRIBUTED AMPLIFIER AND
DIFFERENTIAL DISTRIBUTED AMPLIFIER

BACKGROUND OF THE INVENTION

1. Field of the Invention

The present invention relates to the construction of a distributed amplifier and differential distributed amplifier for use in high-frequency amplifiers in the microwave band, in the millimeter wave band, etc.

2. Description of the Related Art

Generally, when amplification is performed by using FETs, it is required to increase the total gate width of the FETs in order to obtain higher output. When the frequency to be used is high, even if the unit gate width is increased, this measure is ineffective because of electrical delay, gate resistance loss, etc., and accordingly a comb-shaped construction with a large number of gate fingers is adopted.

Figure 9:
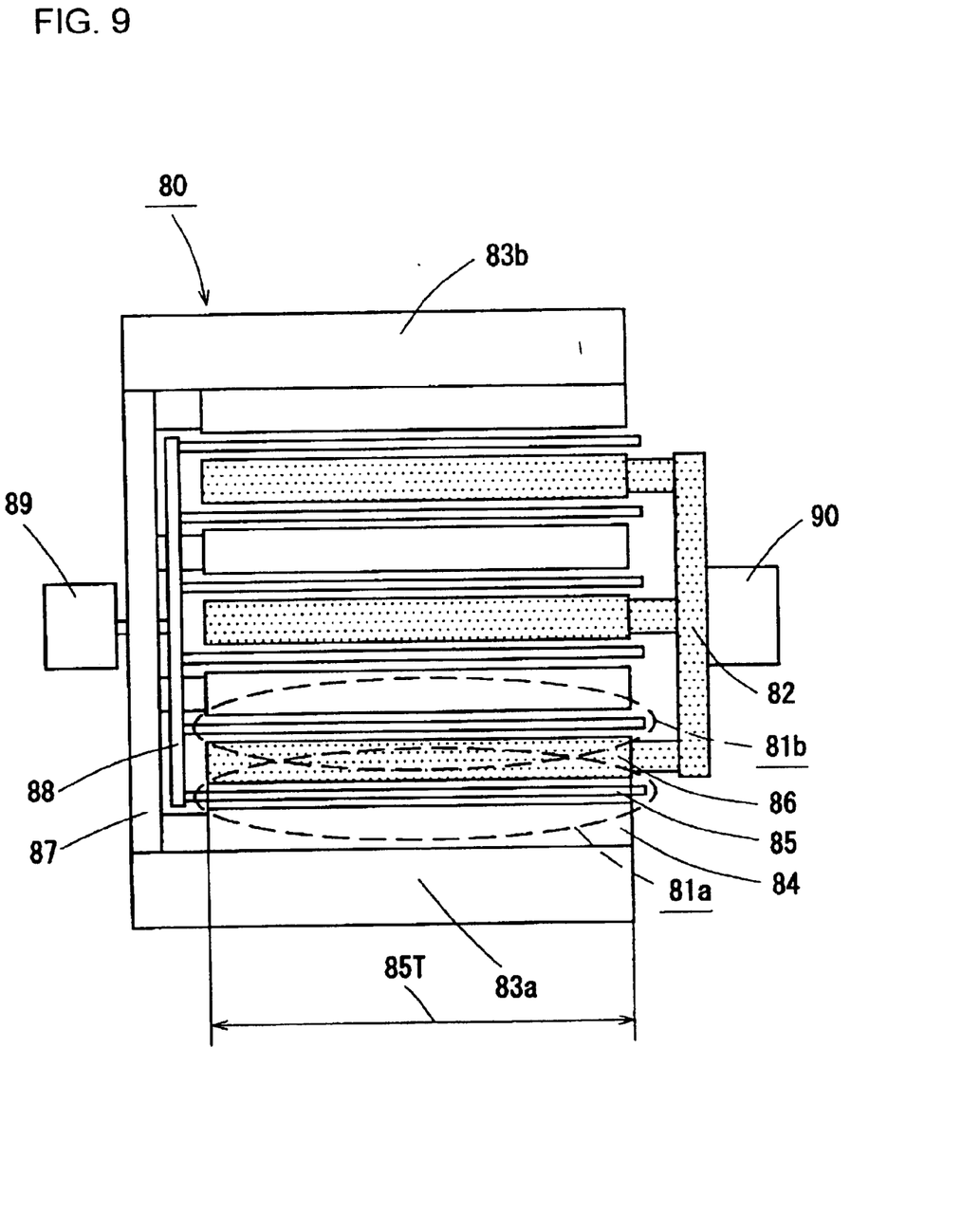
FIG. 9 shows the construction of a known comb-shaped FET.

The construction of a known type of comb-shaped FET is shown in FIG. 9. As shown in FIG. 9, the comb-shaped FET 80 is made of a unit FET 81a which is composed of a source electrode 84, a drain electrodes 86, and a gate electrode 85 disposed therebetween. A neighboring unit FET 81b has the same drain electrode 86 as the unit FET 81a. In this way, six unit FETs are constructed. These unit FETs are disposed so as to have a comb-shaped construction by using a source wiring 87, a drain wiring 82, and a gate wiring 88. Moreover, the source wiring 87 is connected to grounding portions (source pads) 83a and 83b, the drain wiring 82 is connected to an output portion (drain pad) 90, and the gate wiring 88 is connected to an input portion (gate pad) 89. Here, the unit gate width of the unit FET is shown by 85T.

Figure 10:
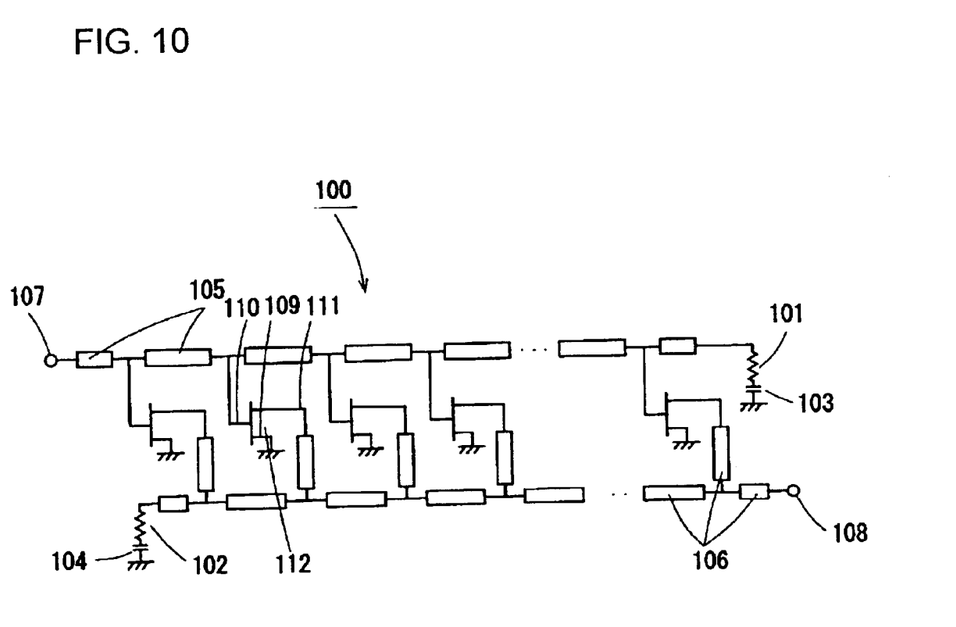
FIG. 10 is the circuit diagram of a known distributed amplifier using the FET of FIG. 9.

The circuit diagram of a distributed amplifier using the comb-shaped FET of FIG. 9 is shown in FIG. 10. As shown in FIG. 10, in the distributed amplifier 100, a plurality of unit FETs 112 each made of a source electrode 109, a drain electrode 111, and a gate electrode 110 are connected in parallel. An input portion 107 comprises an input terminal connected to the gate electrode of each unit FET through high-impedance transmission lines 105. The opposite end of the input portion 107 is grounded through a terminating circuit made of a resistor 101 and a capacitor 103. Furthermore, an output portion 108 comprises an output terminal connected to the drain electrode of each unit FET through high-impedance transmission lines 106. The opposite end of the output portion 108 is grounded through a terminating circuit made of a resistor 102 and a capacitor 104. Furthermore, the source electrode of each unit FET is grounded.

However, in the comb-shaped FET 80, the lengths of the paths in which a signal passes inside the FET 80 are short in the unit FETs located close to the input portion 89 and the output portion 90, that is, in the inside unit FETs, and the lengths of the paths are long in the outside unit FETs. Therefore, because of the difference in the paths in which a signal passes, when a signal is distributed to each gate electrode, a difference in phase of the signals is caused, and also there is a problem in that the phase difference is produced when the signals from all the drain electrodes are synthesized. Furthermore, when each source electrode is connected to the grounding portions 83a and 83b, since the line lengths, which are dependent on the location of each unit FET, are different from each other, there is a problem in that the source impedance is different from one unit FET to another.

In order to avoid such effects, as the frequency to be used increases, the size of the FETs is required to be reduced, but this is contradictory to the purpose of obtaining higher output. Therefore, there is a problem that it is difficult to increase the output even if a comb-shaped construction is adopted.

Moreover, in the distributed amplifier 100 using this comb-shaped FET, a resistor 101 is used in the terminal of the circuit which electrically connects the gate electrodes in consecutive order. Because of this, in low-noise amplifiers, there is a problem in that the NF (noise figure) increases. Furthermore, a resistor 102 is used in the terminal of the circuit which electrically connects the drain electrodes in consecutive order. Accordingly, in high-output amplifiers, there is a problem in that the electric power is consumed in the resistor 102.

SUMMARY OF THE INVENTION

In order to overcome the problems described above, preferred embodiments of the present invention provide a distributed amplifier and differential distributed amplifier in which a low noise amplifier or high output amplifier can be easily fulfilled without causing phase differences.

According to a preferred embodiment of the present invention, a distributed amplifier may comprise two or more unit FETs, each having a source electrode, a drain electrode, and a belt-shaped gate electrode arranged therebetween, the unit FETs being substantially linearly arranged in the length direction of the gate electrode on a substrate; each pair of neighboring source electrodes, neighboring drain electrodes, and neighboring gate electrodes being electrically connected to each other by a respective circuit in consecutive order of the two or more unit FETs; and an input portion connected to one end of the circuit that connects the gate electrodes, and an output portion connected to one end of the circuit that connects the drain electrodes. In the distributed amplifier, an inductor or high-impedance transmission line may be provided in one or more of the connection portions in the circuits between the neighboring drain electrodes or between the neighboring gate electrodes; or a capacitor may be provided in one or more of the connection portions in the circuits between the drain electrodes and the source electrodes or between the gate electrodes and the source electrodes.

Furthermore, in a distributed amplifier of the present invention, a terminating circuit having any one of an inductor, a capacitor, and a transmission line or having a combination of these may be connected to the end opposite to the input portion of the circuit that connects the gate electrodes electrically in consecutive order.

Furthermore, in a distributed amplifier of the present invention, a terminating circuit having any one of an inductor, a capacitor, and a transmission line or having a combination of these may be connected to the end opposite to the output portion of the circuit that connects the drain electrodes electrically in consecutive order.

Furthermore, in a distributed amplifier of the present invention, a terminating circuit having any one of an inductor, a capacitor, and a transmission line or having a combination of these may be connected to the end opposite to the input portion of the circuit that connects the gate electrodes electrically in consecutive order and to the end opposite to the output portion of the circuit that connects the drain electrodes electrically in consecutive order.

Furthermore, in a distributed amplifier of the present invention, a terminating circuit having at least a resistor may be connected to the end opposite to the output portion of the circuit that connects the drain electrodes electrically connected in consecutive order.

Furthermore, in a distributed amplifier of the present invention, a terminating circuit having at least a resistor may be connected to the end opposite to the input portion of the circuit that connects the circuit gate electrodes electrically in consecutive order.

Furthermore, a differential distributed amplifier may comprise two of the distributed amplifiers described above; and a belt-shaped source wiring metal formed between the distributed amplifiers. In the differential distributed amplifier, the two distributed amplifiers are arranged symmetrically with respect to said source wiring metal with the respective source electrodes facing each other, and the source wiring metal interconnects the respective source electrodes of the pair of distributed amplifiers.

Furthermore, in the differential distributed amplifier, the terminating circuits connected to the ends opposite to the input portions of the respective circuits interconnecting the corresponding gate electrodes, are electrically separated from the source wiring metal, and are connected to each other.

Furthermore, in the differential distributed amplifier, the terminating circuits connected to the ends opposite to the output portions of the respective circuits interconnecting the corresponding drain electrodes, are electrically separated from the source wiring metal, and are connected to each other.

When constructed in this way, in a distributed amplifier and differential distributed amplifier of the present invention, low-noise amplification or high-output amplification can be easily fulfilled without having any phase difference.

Other features, elements, characteristics and advantages of the present invention will become more apparent from the following detailed description of preferred embodiments of the present invention with reference to the attached drawings.

DESCRIPTION OF THE PREFERRED EMBODIMENTS

Hereinafter, a distributed amplifier according to a first embodiment of the present invention is described with reference to the construction shown in FIG. 1 and the circuit diagram in FIG. 2.

Figure 1:
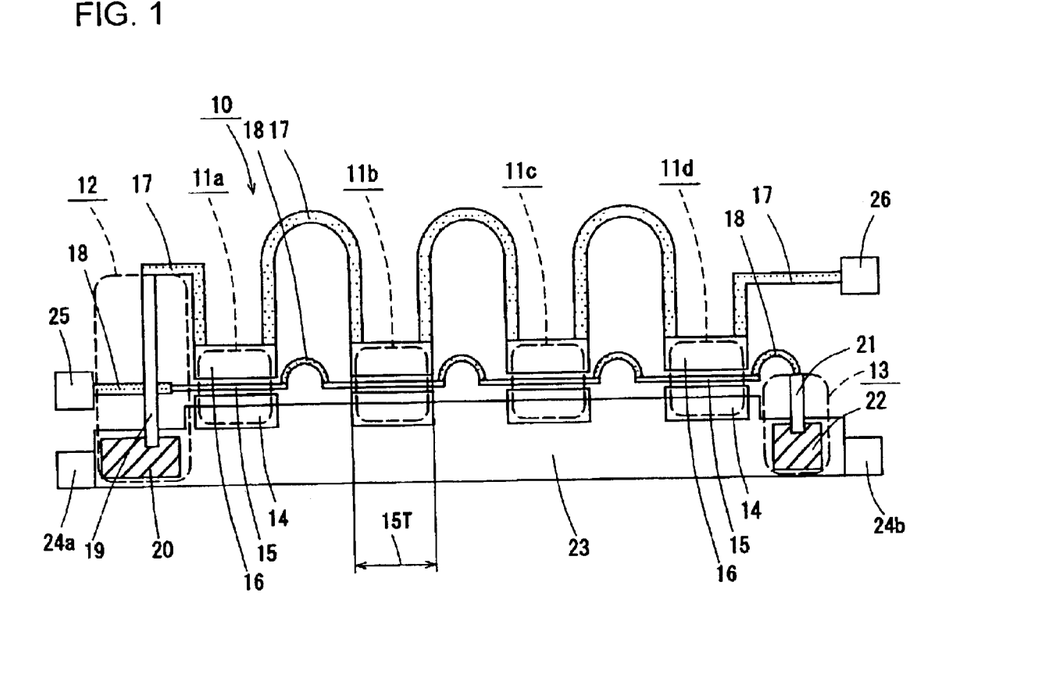
FIG. 1 shows the construction of a first embodiment of a distributed amplifier and differential distributed amplifier of the present invention.
Figure 2:
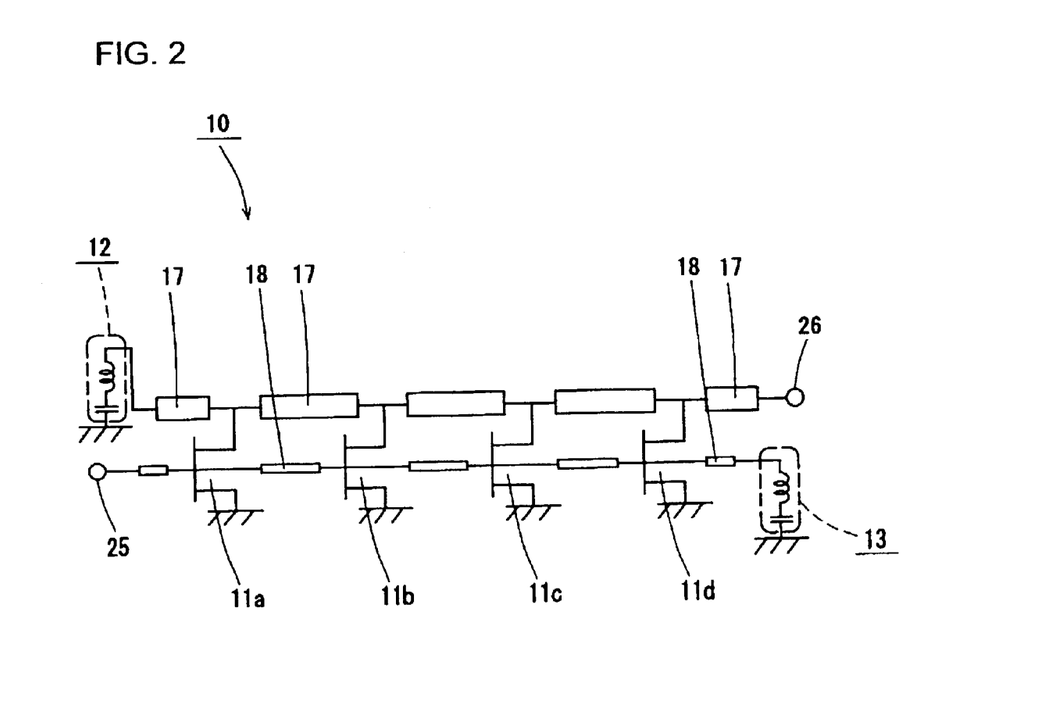
FIG. 2 is the circuit diagram of the first embodiment of the present invention.

As shown in FIGS. 1 and 2, each of unit FETs 11a to 11d is made of a source electrode 14, a drain electrode 16, and a belt-shaped gate electrode 15 disposed there between. These four unit FETs 11a to 11d, respectively, are linearly disposed from left to right in the length direction of the gate electrode 15 on a substrate (not illustrated). The neighboring source electrodes 14, the neighboring drain electrodes 16, and the neighboring gate electrodes 15 of the unit FETs 11a to 11d, respectively, are electrically connected in series. An input portion 25 is connected to one end of the gate electrodes 15 which are electrically connected in consecutive order (in series), and an output portion 26 is connected to one end of the drain electrodes 16 which are electrically connected in consecutive order (in series).

Each pair of the neighboring gate electrodes 15 of the unit FETs 11a to 11d are connected to each other through a respective high-impedance transmission line 18. The other end of the series of gate electrodes 15 which is opposite to the input portion 25 is connected to a source wiring metal 23 through a terminating circuit 13. In detail, the right end of the gate electrode 15 of the unit FET 11d is connected to the terminating circuit 13 through a high-impedance transmission line 18, and the other end of the terminating circuit 13 is connected to the source wiring metal 23. In the terminating circuit 13, a transmission line 21 and a capacitor 22 are connected in series.

In the same way, each pair of the neighboring drain electrodes 16 of the unit FETs 11a to 11d are connected to each other through a respective high-impedance transmission line 17. The other end of the series of drain electrodes 16 which is opposite to the output portion 26 is connected to the source wiring metal 23 through a terminating circuit 12. In detail, the left end of the drain electrode 16 of the unit FET 11a is connected to the terminating circuit 12 through a high-impedance transmission line 17, and the other end of the terminating circuit 12 is connected to the source wiring metal 23. In the terminating circuit 12, a transmission line 19 and a capacitor 20 are connected in series.

Furthermore, the long, narrow source wiring metal 23 is formed in the vicinity of the source electrodes 14 and extends in the length direction of the gate electrodes 15. In this way, the source electrodes 14 of the four unit FETs 11a to 11d are connected. Grounding portions (source pads) 24a and 24b are provided on the source wiring metal 23.

Here, a signal is input from the input portion (gate pad) 25 connected to the leftmost gate electrode 15 in FIG. 1, and a signal is output from the output portion (drain pad) 26 connected to the rightmost drain electrode 16 in FIG. 1.

The operation and effect of the distributed amplifier 10 will now be described.

1) The delay time of a signal can be changed by changing the respective lengths of the high-impedance transmission lines 18. Thus, the delay time of a signal in the transmission line extending to the source electrodes 14 from the gate electrodes 15 electrically connected in consecutive order can be adjusted. Furthermore, the delay time of a signal can be changed by changing the respective lengths of the high-impedance transmission lines 17. In this way, the delay time of a signal in the transmission line extending to the source electrodes 14 from the drain electrodes 16 electrically connected in consecutive order can be adjusted. As a result, it becomes possible to make adjustments so that there is no phase difference between signals input to the unit FETs 11a to 11d and there is no phase difference between signals output from the unit FETs 11a to 11d.

2) Since the delay time of a signal can be easily adjusted, the unit gate width 15T can be set a little longer than that in the known construction and accordingly higher output can be obtained more easily.

3) The delay time of a signal in the transmission line formed of the unit FETs 11a to 11d electrically connected in consecutive order and the terminating circuits 13 and 12 of the gate electrodes 15 and drain electrodes 16 electrically connected in consecutive order can be adjusted at the same time. In this way, the conditions for impedance matching between the distributed amplifier 10 and a system in front of or behind the distributed amplifier 10 are made more flexible. Thus, the impedance matching can be made more easily than in the case of the known construction.

Heterojunction FETs having a total gate width of 150 μm have been practically studied and the results are shown below.

A) The impedance matching is performed by providing the input portion of the gate and the output portion of the drain of one FET having a belt-shaped gate electrode of a gate width 150 μm with matching circuits.

B) The same FET as in A) is used and the impedance matching is performed by providing the input portion of the gate and its opposite end and the output portion of the drain and its opposite end with matching circuits.

C) A unit FET having a belt-shaped gate electrode of gate width 10 μm is made. Fifteen unit FETs are linearly arranged in the length direction of the gate electrode. The gate electrodes and the drain electrodes of the unit FETs are connected through respective inductors. The opposite end of the circuit connecting the input portion of the gate electrodes and the opposite end of the circuit connecting the output portion of the drain electrodes in consecutive order are connected to the source wiring metal through terminating circuits of an inductor and a capacitor. Then, as an example of the present invention, impedance matching is performed at the input portion of the gate electrodes and the output portion of the drain electrodes electrically connected in consecutive order.

D) The impedance matching is performed without connecting any terminating circuit to the opposite end of the input portion of the gate electrodes and the opposite end of the output portion of the drain electrodes electrically connected in consecutive order in C).

In these cases, the characteristics were studied in order to obtain a distributed amplifier for operating at 38 GHz. As a result, in the cases described above at A) and B), no impedance matching could be performed. In the case described above at D), although impedance matching could be performed and gain could obtained in a desired bandwidth, there was also gain in an unnecessary frequency range further there was a negative resistance, and accordingly it was found that a practical distributed amplifier could not be obtained.

In contrast, in the case described above at C), the impedance matching could be performed with a system in front of or behind the distributed amplifier of the present invention and also gain could be assured in the desired frequency range.

In this circuit, the inductance between the gate electrodes was set to be 2 pH and the inductance between the drain electrodes was set to be 0.11 nH. A series circuit of an inductance of 0.1 pH and a capacitance of 10 pF was connected to the end opposite to the input portion of the circuit connecting the gate electrodes in consecutive order. Also a series circuit of an inductance 1 pH and a capacitance 10 pF was connected to the end opposite to the output portion of the circuit connecting the drain electrodes in consecutive order.

As a result, the delay time of a signal between the unit FETs and the terminating circuits can easily be adjusted at the same time.

4) The end opposite to the input portion 25 of the circuit connecting the gate electrodes 15 and the end opposite to the output portions 26 of the circuit connecting the drain electrodes 16 are terminated not by any resistor, but rather by a reactive element and a transmission line. Accordingly, the problem of the noise increase and power dissipation due to the resistors in the known distributed amplifiers, can be eliminated and lower-noise and higher-output products can be developed.

5) The source impedance can be made substantially zero by linearly arranging the unit FETs 11a to 11d and by directly connecting the source electrodes 14 to the source wiring metal 23 without any space therebetween. If there should be any difference in source impedance between the unit FETs 11a to 11d, an inductance can be intentionally inserted between the source electrodes 14 and the source wiring metal 23. In this way, each of the unit FETs 11a to 11d can be made to have the same source impedance. The reduction and uniformity of source impedance are favorable for the suppression of losses and for the impedance matching of the low-noise amplifiers.

The device shown in FIG. 1 can be modified. It is desirable that, as shown in FIG. 1, both of the terminating circuits 13 and 12 are provided, connected to the gate electrode 15 and drain electrode 16, respectively. However, even if only one of the electrodes 15 and 16 is provided with a terminating circuit, the effect can be obtained.

Furthermore, the width 15T of the gate electrodes 15 of the unit FETs 11a to 11d and the number of the unit FETs can be modified appropriately based on the frequency to be used and the desired characteristics.

Furthermore, instead of using the source wiring metal 23, the connection may be made with a metal showing an ohmic contact to semiconductors or with a high-density impurity semiconductor.

Moreover, in the example, the high-impedance lines 18 and 17 for connecting the gate electrodes 15 and the drain electrodes 16 have the same construction. However, they may have different constructions between respective pairs of the unit FETs 11a to 11d to obtain an appropriate delay time of a signal, and they may be connected to result in zero inductance.

Furthermore, the delay time of a signal may be adjusted by forming a capacitor between the gate electrodes 15 and the source electrodes 14 and between the drain electrodes 16 and the source electrodes 14 instead of an inductor or high-impedance transmission lines 18 and 17 inserted between the gate electrodes 15 and between the drain electrodes 16. The delay time of a signal may further be adjusted by using such a capacitor together with the inductor and/or the high-impedance transmission lines 17 and 18.

Moreover, although the word "left" or "right" has been used to show the location in the drawings here, it is used for the sake of convenience and does not limit the invention.

The same thing can be said about the following description.

Figure 3:
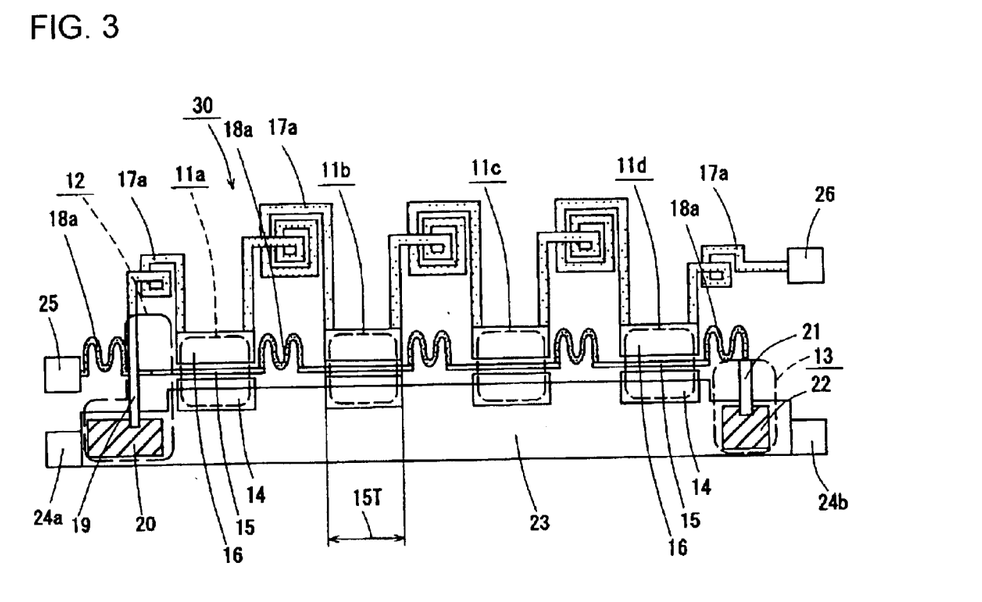
FIG. 3 shows the construction of a second embodiment of a distributed amplifier and differential distributed amplifier of the present invention.
Figure 4:
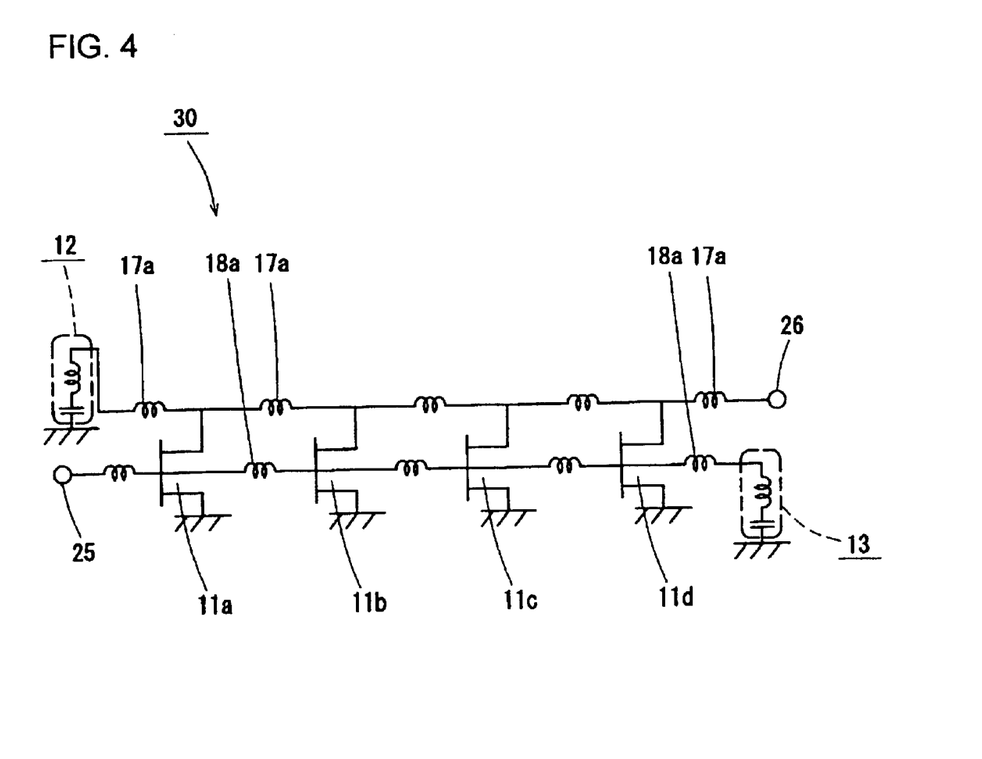
FIG. 4 is the circuit diagram of the second embodiment of the present invention.

Hereinafter, a distributed amplifier according to a second embodiment of the present invention is described with reference to the construction shown in FIG. 3 and the circuit diagram in FIG. 4. In FIGS. 3 and 4, the same or equivalent portions as in FIGS. 1 and 2 are given the same reference numerals and their description is omitted.

As shown in FIGS. 3 and 4, the distributed amplifier 30 is almost the same as the first embodiment shown in FIGS. 1 and 2. What is different is that an inductor is used instead of the high-impedance transmission line.

The neighboring gate electrodes 15 of the unit FETs 11a to 11d are connected through an inductor 18a. The end opposite to the input portion 25 of the circuit connecting the gate electrodes 15 in consecutive order is connected by another inductor 18a to the source wiring metal 23 through the terminating circuit 13. And the input portion 25 is connected to the gate electrode 15 of the unit FET 11a by yet another inductor 18a.

In the same way, the neighboring drain electrodes 16 of the unit FETs 11a to 11d are connected through an inductor 17a. The end opposite to the output portion 26 of the circuit which connects the drain electrodes 16 in consecutive order is connected by another inductor 17a to the source wiring metal 23 through the terminating circuit 12. In the terminating circuit 12, the transmission line 19 and the capacitor 20 are connected in series. And the output portion 26 is connected to the drain electrode 16 of the unit FET 11d by yet another inductor 17a.

In such a construction, the same operation and effect as in the example in FIG. 1 can be obtained. Moreover, if the inductor and high-impedance transmission line are used together, the same operation and effect can be obtained.

Figure 5:
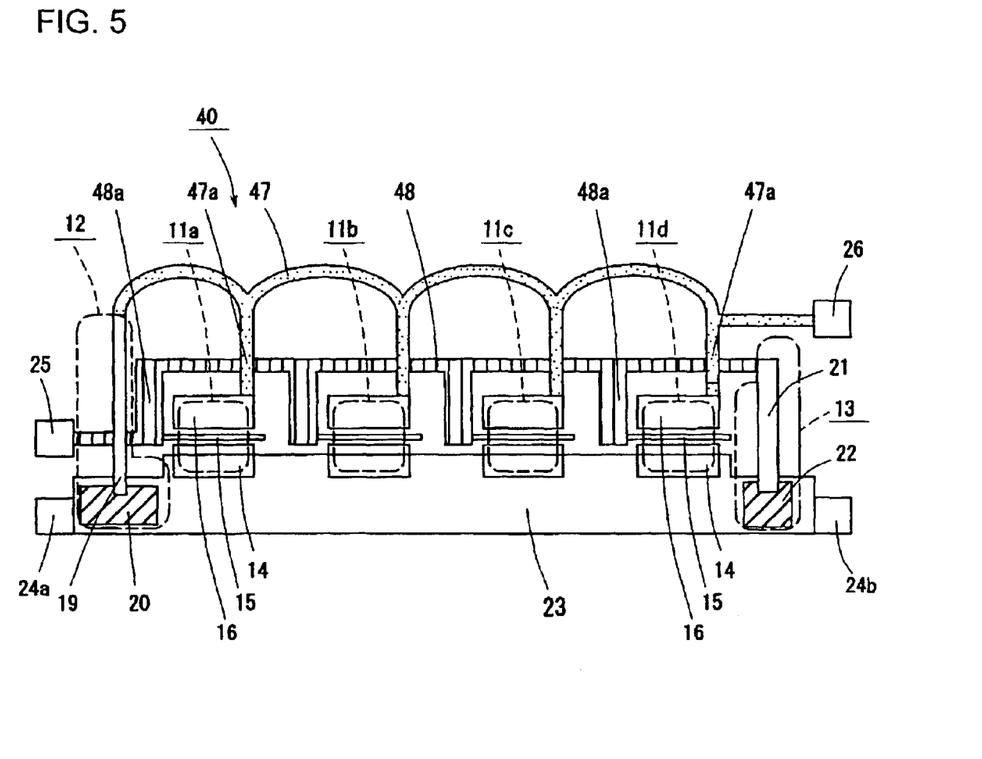
FIG. 5 shows the construction of a third embodiment of a distributed amplifier and differential distributed amplifier of the present invention.

Hereinafter, a distributed amplifier according to a third embodiment of the present invention is described with reference to the construction shown in FIG. 5. In FIG. 5, the same or equivalent portions as in FIG. 1 are given the same reference numerals and their description is omitted.

As shown in FIG. 5, the distributed amplifier 40 is substantially the same as the first embodiment shown in FIG. 1. What is different is the shape of the high-impedance transmission line. A belt-shaped high-impedance transmission line 48 is provided so as to extend from left to right in the vicinity of the unit FETs 11a to 11d. The high-impedance transmission line 48 is connected to the respective gate electrode 15 of each of the unit FETs 11a to 11d through a corresponding high-impedance transmission line 48a. The right end of the high-impedance transmission line 48 is connected to the terminating circuit 13, and the other end of the terminating circuit 13 is connected to the source wiring metal 23. In the terminating circuit 13, the transmission line 21 and the capacitor 22 are connected in series.

In the same way, a belt-shaped high-impedance transmission line 47 is provided so as to extend from left to right in the vicinity of the unit FETs 11a to 11d. The high-impedance transmission line 47 is connected to the respective drain electrode 16 of each of the unit FETs 11a to 11d through a corresponding high-impedance transmission line 47a. The left end of the high-impedance transmission line 47 is connected to the terminating circuit 12, and the other end of the terminating circuit 12 is connected to the source wiring metal 23. In the terminating circuit 12, the transmission line 19 and the capacitor 20 are connected in series.

In such a construction also, the same operation and effect as in FIG. 1 can be obtained. Furthermore, in the construction in FIG. 5, because of the high-impedance transmission line 48 which is connected to the gate electrodes 15 in consecutive order, and the high-impedance transmission line 47 which is connected to the drain electrodes 16 in consecutive order, the gate electrodes 15 and the drain electrodes 16 are not connected in series, which is different from the case in FIG. 1. Therefore, the resistance from the input portion 25 and the output portion 26 to each electrode can be made smaller than that in the construction in FIG. 1.

Here, instead of the belt-shaped high-impedance transmission line 48, a gate wiring metal similar to the source wiring metal 23 may be provided in the length direction of the gate electrodes 15 above or in the vicinity of the gate electrodes 15. In the same way, instead of the high-impedance transmission line 47, a drain wiring metal may be provided in the length direction of the gate electrodes 15 above or in the vicinity of the drain electrodes 16.

Figure 6:
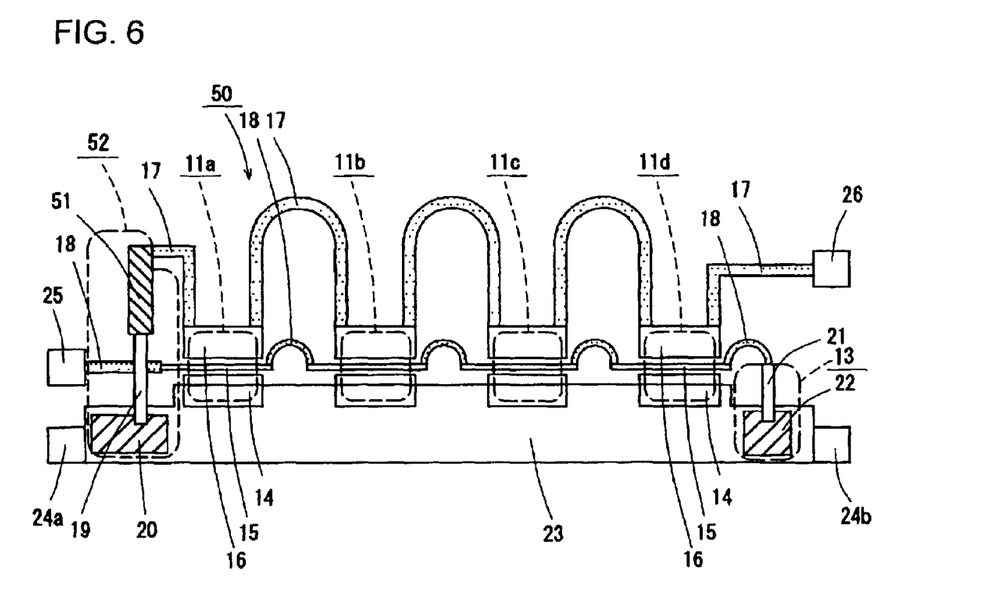
FIG. 6 shows the construction of a fourth embodiment of a distributed amplifier and differential distributed amplifier of the present invention.

Hereinafter, a distributed amplifier according to a fourth embodiment of the present invention is described with reference to FIG. 6. In FIG. 6, the same or equivalent portions as in FIG. 1 are given the same reference numerals and their description is omitted.

As shown in FIG. 6, the distributed amplifier 50 is substantially the same as the first embodiment shown in FIG. 1. What is different is the terminating circuit connected to the drain electrodes 16. The end opposite to the output portion 26 of the circuit connecting the drain electrodes 16 is connected to the source wiring metal 23 through a terminating circuit 52 having a resistor 51. In detail, the left end of the drain electrode 16 of the unit FET 11a is connected to the terminating circuit 52 through the high-impedance transmission line 17, and the other end of the terminating circuit 52 is connected to the source wiring metal 23. In the terminating circuit 52, the resistor 51, the transmission line 19, and the capacitor 20 are connected in series.

The end opposite to the input portion 25 of the circuit which connects the gate electrodes 15 in consecutive order is connected to the source wiring metal 23 through the terminating circuit 13 not having any resistor, in the same way as in FIG. 1.

Here, the characteristic impedance of the transmission line extending to the source electrodes 14 from the drain electrodes 16 electrically connected in consecutive order is adjusted so as to be equal to the characteristic impedance of a system to be connected to the output portion 26 of the distributed amplifier 50. Furthermore, a resistor 51 having the same resistance value as the characteristic impedance is connected to the end opposite to the output portion 26 of the circuit connecting the drain electrodes 16 in consecutive order. Moreover, the resistance value of the resistor 51 can be set differently, if desired characteristics can be obtained.

When constructed in this way, the same operation and effect as in FIG. 1 can be obtained. Moreover, in the case having the construction in FIG. 6, the impedance matching between a system connected to the output portion 26 and the drain electrodes 16 can be obtained over a wide range. Furthermore, since no resistor is contained on the input (front end) side, when a low-noise amplifier is constructed, the impedance matching to a system in front and to a back end system becomes easier than in the example in FIG. 1.

Figure 7:
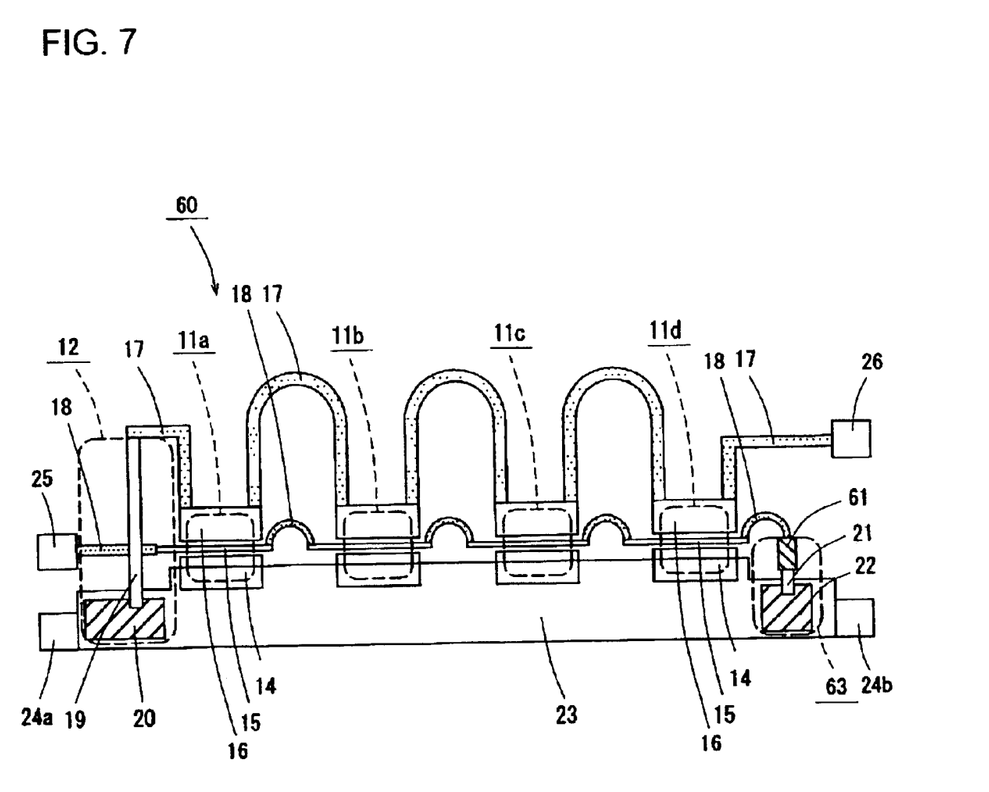
FIG. 7 shows the construction of a fifth embodiment of a distributed amplifier and differential distributed amplifier of the present invention.

Hereinafter, a distributed amplifier according to a fifth embodiment of the present invention is described with reference to FIG. 7. In FIG. 7, the same or equivalent portions as in FIG. 1 are given the same reference numerals and their description is omitted.

As shown in FIG. 7, the distributed amplifier 60 is substantially the same as the first embodiment shown in FIG.

1. What is different is the terminating circuit connected to the gate electrodes 15. The end opposite to the output portion 25 of the circuit which connects the gate electrodes 15 in consecutive order is connected to the source wiring metal 23 through a terminating circuit 63 having a resistor 61. In detail, the right end of the gate electrode 15 of the unit FET 11d is connected to the terminating circuit 63 through the high-impedance transmission line 18, and the other end of the terminating circuit 63 is connected to the source wiring metal 23. In the terminating circuit 63, a resistor 61, a transmission line 21, and a capacitor 21 are connected in series.

The end opposite to the output portion 26 of the circuit connecting the drain electrodes 16 electrically in consecutive order is connected to the source wiring metal 23 through a terminating circuit 12 not having any resistor, in the same way as in FIG. 1.

Here, the characteristic impedance of the transmission line extending to the source electrodes 14 from the gate electrodes 15 electrically connected in consecutive order is adjusted so as to be equal to the characteristic impedance of a front-end system to be connected to the input portion 25 of the distributed amplifier 60. Furthermore, a resistor 61 having the same resistance value as the characteristic impedance is connected to the end opposite to the input portion 25 of the circuit connecting the gate electrodes 15 electrically in consecutive order. Moreover, the resistance value of the resistor 61 can be set differently, if desired characteristics can be obtained.

When constructed in this way, the same operation and effect as in FIG. 1 can be obtained. Moreover, in the case having the construction in FIG. 7, the impedance matching between a front-end system and the gate electrodes 15 can be obtained over a wide range. Furthermore, since no resistor is contained on the output (back end) side, a signal amplified in the unit FETs 11a to 11d can be taken out without dissipation inside the system. Therefore, when a high output amplifier is constructed, the impedance matching to a system at the front end and to a system at the back end becomes easier than in the example in FIG. 1.

Figure 8:
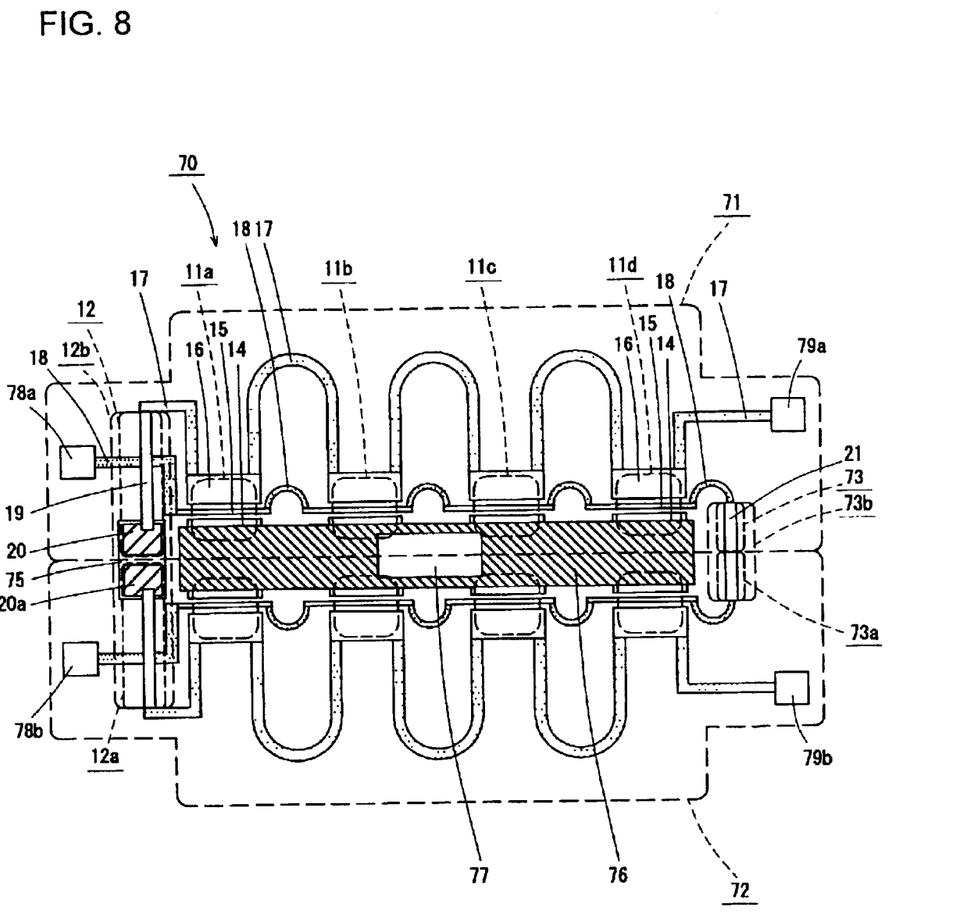
FIG. 8 shows the construction of a sixth embodiment of a distributed amplifier and differential distributed amplifier of the present invention.

Hereinafter, a differential distributed amplifier according to a sixth embodiment of the present invention is described with reference to FIG. 8. Two of the distributed amplifiers shown in FIG. 1 are used in this differential distributed amplifier. In FIG. 8, the same or equivalent portions as in FIG. 1 are given the same reference numerals and their description is omitted.

As shown in FIG. 8, in a first construction 71, one end of the terminating circuit 73 corresponding to the gate electrodes 15, and one end of the terminating circuit 12 corresponding to the drain electrodes 16, are left open. Except for this, the construction is the same as in the first embodiment in FIG. 1.

A second construction 72 is provided such that the second construction 72 is symmetrical to the first construction 71 with respect to a line and that both the source electrodes face each other. The terminating circuit 73 comprises the transmission line 21, and the terminating circuit 12 comprises a series circuit of the transmission line 19 and the capacitor 20.

Moreover, the source wiring metals of the first construction 71 and the second construction 72 are connected to each other, as a belt-shaped source wiring metal 76, and a grounding portion 77 is provided on this source wiring metal 76.

The open end of the terminating circuit 73 of the first construction 71 and the open end of the terminating circuit 73a of the second construction, both of which are electrically separated from the source wiring metal 76, are connected to each other. Furthermore, the open end of the terminating circuit 12 of the first construction 71 and the open end of the terminating circuit 12a of the second construction 72, both of which are electrically separated from the source wiring metal 76, are connected to each other. At this time, the capacitor 20 of the first construction 71 and a capacitor 20a of the second construction 72 are connected in series by a wiring 75. In this way, new terminating circuits 73b and 12b are formed.

Here, the capacitors 20 and 20a are for matching purposes and do not perform the function of blocking DC.

The input portion 78a of the first construction 71 and the input portion 78b of the second construction 72, both provided at the left end, the output portion 79a of the first construction 71 and the output portion 79b of the second construction 72, both provided at the right end, and the grounding portion 77 are connected to the outside.

In the differential distributed amplifier 70, a balanced signal is input between the input portion 78a and the input portion 78b, and a balanced signal is output between the output portion 79a and the output portion 79b.

With the differential distributed amplifier 70, the impedance matching to a system at the front end and to a system at the back end can be fulfilled in the same way as in the example in FIG. 1. Furthermore, by adding resistors to the terminating circuits, the impedance matching in a wide range can be performed in the same way as with the examples in FIGS. 6 and 7.

Moreover, the following effect can also be obtained. According to the differential distributed amplifier 70, since the source wiring metal 76 is outwardly grounded for a high-frequency signal, the source impedance becomes zero. As a result, the deterioration of gain which is caused by the occurrence of a source impedance can be avoided.

In a millimeter-wave amplifier, a flip-chip bonding method using bumps and a via-hole method are generally used to connect the source electrodes to the outside. However, these methods limit the construction and may become main causes of an increase of cost. According to the differential distributed amplifier 70, the grounding for a high-frequency signal becomes independent of the method of connection of the source wiring metal 76 to the outside and the above problems are solved. Furthermore, even if the terminating circuits 73b and 12b are not connected to the source wiring metal 76, they are equivalent to being grounded for a high frequency signal. This means that the terminating circuits 73b and 12b do not require capacitors for interrupting DC current, and accordingly the area to be occupied by them can be reduced.

Moreover, the terminating circuits 73 and 12 are not limited to the examples shown, and the terminating circuits described in FIGS. 1 to 7 can be applied instead.

According to the present invention, since the delay time of a signal and the terminating circuits can be simultaneously adjusted, impedance matching to an outside circuit can be easily fulfilled at high frequencies such as the millimeter-wave band, etc. In this way, a low-noise amplifier can be constructed without deteriorating noise performance, and a high output amplifier can be constructed without decreasing the output.

Furthermore, when a differential distributed amplifier is constructed, since the source impedance becomes zero, a signal can be amplified without deteriorating the gain.

Although the present invention has been described in relation to particular embodiments thereof, many other variations and modifications and other uses will become apparent to those skilled in the art. Therefore, the present invention is not limited by the specific disclosure herein.

What is claimed is:

1. A distributed amplifier comprising:

two or more unit FETs, each having a source electrode, a drain electrode, and a belt-shaped gate electrode arranged therebetween, the unit FETs being substantially linearly arranged in the length direction of the gate electrode on a substrate;

each pair of neighboring source electrodes, neighboring drain electrodes, and neighboring gate electrodes being electrically connected to each other by a respective circuit in consecutive order of the two or more unit FETs; and an input portion connected to one end of the circuit which connects the gate electrodes, and an output portion connected to one end of the circuit which connects the drain electrodes, wherein an inductor or high-impedance transmission line is provided in either or both of the circuit which connects the neighboring drain electrodes and the circuit which connects the neighboring gate electrodes.

2. A distributed amplifier as claimed in claim 1, wherein a terminating circuit having one or more of an inductor, a capacitor, and a transmission line is connected to an opposite end of the circuit that connects the gate electrodes.

3. A distributed amplifier as claimed in claim 2, wherein a terminating circuit having at least a resistor is connected to an opposite end of the circuit that connects the drain electrodes.

4. A distributed amplifier as claimed in claim 1, wherein a terminating circuit having one or more of an inductor, a capacitor, and a transmission line is connected to an opposite end of the circuit that connects the drain electrodes.

5. A distributed amplifier as claimed in claim 4, wherein a terminating circuit having at least a resistor is connected to an opposite end of the input circuit that connects the gate electrodes.

6. A distributed amplifier as claimed in claim 4, wherein a terminating circuit having one or more of an inductor, a capacitor, and a transmission line is connected to an opposite end of the circuit that connects the gate electrodes.

7. A distributed amplifier as claimed in claim 1, wherein said neighboring gate electrodes are connected in series by the corresponding said circuit.

8. A distributed amplifier as claimed in claim 1, wherein said neighboring gate electrodes are connected in parallel by the corresponding said circuit.

9. A distributed amplifier as claimed in claim 1, wherein said neighboring drain electrodes are connected in series by the corresponding said circuit.

10. A distributed amplifier as claimed in claim 1, wherein said neighboring drain electrodes are connected in parallel by the corresponding said circuit.

11. A distributed amplifier comprising:

two or more unit FETs, each having a source electrode, a drain electrode, and a belt-shaped gate electrode arranged therebetween, the unit FETs being substantially linearly arranged in the length direction of the gate electrode on a substrate;

each pair of neighboring source electrodes, neighboring drain electrodes, and neighboring gate electrodes being electrically connected to each other by a respective circuit in consecutive order of the two or more unit FETs; and an input portion connected to one end of the circuit which connects the gate electrodes, and an output portion connected to one end of the circuit which connects the drain electrodes, wherein a capacitor is provided interconnecting a circuit between the drain electrodes and the source electrodes; or interconnecting a circuit between the gate electrodes and the source electrodes; or both.

12. A differential distributed amplifier comprising:

a pair of distributed amplifiers, each being a distributed amplifier as claimed in any one of claims 1 and 11; and a belt-shaped source wiring metal formed between the distributed amplifiers, wherein the two distributed amplifiers are arranged symmetrically to each other with respect to said source wiring metal with the respective source electrodes of the pair of distributed amplifiers facing each other, and wherein the source wiring metal interconnects the respective source electrodes of the pair of distributed amplifiers.

13. A differential distributed amplifier as claimed in claim 12, wherein the terminating circuits connected to the ends opposite to the input portions of the respective circuits interconnecting the corresponding gate electrodes, are electrically separated from the source wiring metal, and are connected to each other.

14. A differential distributed amplifier as claimed in claim 12, wherein the terminating circuits connected to the ends opposite to the output portions of the respective circuits interconnecting the corresponding drain electrodes, are electrically separated from the source wiring metal, and are connected to each other.

* * * * *